(12) United States Patent
Matsuda et al.

(10) Patent No.: US 12,278,514 B2
(45) Date of Patent: Apr. 15, 2025

(54) MASK CONTROL CIRCUIT, CONTROLLER INCLUDING THE MASK CONTROL CIRCUIT, CHARGE/DISCHARGE CONTROL CIRCUIT, AND BATTERY DEVICE

(71) Applicant: ABLIC Inc., Tokyo (JP)

(72) Inventors: Takashi Matsuda, Tokyo (JP); Takashi Ono, Tokyo (JP)

(73) Assignee: ABLIC Inc., Nagano (JP)

( * ) Notice: Subject to any disclaimer, the term of this patent is extended or adjusted under 35 U.S.C. 154(b) by 668 days.

(21) Appl. No.: 17/546,000

(22) Filed: Dec. 8, 2021

(65) Prior Publication Data

US 2022/0190625 A1     Jun. 16, 2022

(30) Foreign Application Priority Data

Dec. 10, 2020  (JP) .................................. 2020-204645
Oct. 7, 2021   (JP) .................................. 2021-165249

(51) Int. Cl.
*H02J 7/00*      (2006.01)
*G01R 19/165*    (2006.01)

(52) U.S. Cl.
CPC .. *H02J 7/007182* (2020.01); *G01R 19/16538* (2013.01); *H02J 7/00302* (2020.01); *H02J 7/00304* (2020.01); *H02J 7/00309* (2020.01); *H02J 7/0032* (2013.01); *H02J 7/0048* (2020.01); *H02J 7/0063* (2013.01); *H02J 7/007192* (2020.01)

(58) Field of Classification Search
CPC ............. H02J 7/007182; H02J 7/00302; H02J 7/00304; H02J 7/00309; H02J 7/0032; H02J 7/0048; H02J 7/0063; H02J 7/007192; H02J 7/0047; H02J 7/00306; H02J 7/0031; H02J 7/0068; H02J 7/00712; H02J 2207/10; G01R 19/16538
USPC ........................................................ 320/136
See application file for complete search history.

(56) References Cited

U.S. PATENT DOCUMENTS

| 7,772,805 B2 * | 8/2010 | Yamamoto ......... H01M 50/202 |
| | | 320/132 |
| 2002/0089308 A1 * | 7/2002 | Sakurai ................ H02J 7/0047 |
| | | 320/134 |

(Continued)

FOREIGN PATENT DOCUMENTS

| JP | 2005229774 | 8/2005 |
| JP | 2017208949 | 11/2017 |

*Primary Examiner* — Drew A Dunn
*Assistant Examiner* — Atm M Rahman
(74) *Attorney, Agent, or Firm* — JCIPRNET

(57) ABSTRACT

Operational instability is prevented without compromising the state transition speed. A mask control circuit is a circuit which generates a mask signal masking a control signal during a period in which a voltage level of a monitoring target terminal to be monitored is transitioning. The mask control circuit includes: a first input port which receives a signal supplied to the monitoring target terminal; a second input port which receives a signal representing the voltage level of the monitoring target terminal; a logic circuit which determines whether the voltage level of the monitoring target terminal is in transition based on signals received from the first input port and the second input port; and an output port which outputs a signal indicating a determination result of whether the voltage level of the monitoring target terminal is in transition as the mask signal.

9 Claims, 4 Drawing Sheets

(56) References Cited

U.S. PATENT DOCUMENTS

| | | | |
|---|---|---|---|
| 2005/0182987 A1 | 8/2005 | Sakurai | |
| 2008/0106395 A1* | 5/2008 | Kizawa | H02J 7/14 340/455 |
| 2008/0203971 A1* | 8/2008 | Sakurai | H02J 7/0034 320/134 |
| 2016/0285290 A1* | 9/2016 | Takei | H02J 5/00 |
| 2017/0338812 A1* | 11/2017 | Hokazono | H03K 17/18 |

* cited by examiner

| SIGNAL<br>CO VOLTAGE IS: | S3 | S9 | S11 | S13 | S7 |
|---|---|---|---|---|---|
| (A) DURING A TRANSITION FROM HIGH TO LOW | H | L | L | L | H |
| (B) LOW | L | L | H | L | L |
| (C) DURING A TRANSITION FROM LOW TO HIGH | L | H | L | L | H |
| (D) HIGH | H | H | L | H | L |

FIG. 4

| SIGNAL<br>STATE | S3 | S9 | S11 | S13 | S7 |
|---|---|---|---|---|---|
| (A) DURING A TRANSITION FROM THERMAL PROTECTION RELEASE STATE TO THERMAL PROTECTION STATE | H | L | L | L | H |
| (B) THERMAL PROTECTION STATE | L | L | H | L | L |
| (C) DURING A TRANSITION FROM THERMAL PROTECTION STATE TO THERMAL PROTECTION RELEASE STATE | L | H | L | L | H |
| (D) THERMAL PROTECTION RELEASE STATE | H | H | L | H | L |

FIG. 5

MASK CONTROL CIRCUIT, CONTROLLER INCLUDING THE MASK CONTROL CIRCUIT, CHARGE/DISCHARGE CONTROL CIRCUIT, AND BATTERY DEVICE

CROSS-REFERENCE TO RELATED APPLICATION

This application claims the priority benefits of Japanese application no. 2020-204645, filed on Dec. 10, 2020, and Japanese application no. 2021-165249, filed on Oct. 7, 2021. The entirety of each of the above-mentioned patent applications is hereby incorporated by reference herein and made a part of this specification.

BACKGROUND

Technical Field

The present invention relates to a mask control circuit, a controller including the mask control circuit, a charge/discharge control circuit, and a battery device.

Description of Related Art

For example, an electric device such as a battery device includes a control circuit which controls an operation according to a state. Generally, the battery device includes a charge/discharge control circuit which detects an overcharged state, an overdischarged state, etc. and controls the charge/discharge of a secondary battery, thereby protecting the secondary battery. Since the charge/discharge control circuit detects the overcharged state, the overdischarged state, etc. and controls the charge/discharge of the secondary battery, the charge/discharge control circuit includes a positive power supply terminal and a negative power supply terminal for monitoring a voltage of the secondary battery, a charge control terminal connected to a gate of a charge control FET (Field Effective Transistor) which controls the charge of the secondary battery, a discharge control terminal connected to a gate of a discharge control FET which controls the discharge of the secondary battery, and an external negative voltage input port receiving a voltage of a negative electrode terminal (hereinafter referred to as "external negative electrode terminal") among external terminals to which a charger of the secondary battery or an external load is connected.

In addition, the charge/discharge control circuit has a power-down function for prohibiting discharge to the load and reducing the current consumption inside the charge/discharge control circuit when the overdischarged state is detected (see, for example, Japanese Patent Application Laid-Open No. 2005-229774).

The charge/discharge control circuit with the power-down function can switch the power-down function "on" or "off" to switch between a power-down state in which the current consumption inside the charge/discharge control circuit is reduced and a power-down release state in which the current consumption inside the charge/discharge control circuit is not reduced. Whether to turn on the power-down function is, for example, determined according to whether the secondary battery is in the overdischarged state and whether the voltage of the external negative voltage input port is equal to or higher than a preset voltage (hereinafter referred to as "determination voltage").

SUMMARY

For the charge/discharge control circuit and the battery device described above, setting the determination voltage low, that is, setting it to a voltage close to the voltage supplied to the negative power supply terminal, is advantageous from the viewpoint of speeding up the transition to the power-down state.

However, if the determination voltage is set low, an oscillation operation of the power-down function in which the power-down function is repeatedly turned "on" and "off" may occur, as will be described later. That is, although setting the determination voltage low is advantageous in terms of the state transition speed, it is disadvantageous in terms of the operational stability of the charge/discharge control circuit.

Next, the oscillation operation of the power-down function will be described. When the charge/discharge control circuit is in the overdischarged state and the power-down state, the voltage of the discharge control terminal is at a low (hereinafter simply referred to as "L") level. Further, the voltage of the charge control terminal in the power-down state can be at either a high (hereinafter simply referred to as "H") level or the L level, but here it is described as being at the L level.

When the charge/discharge control circuit is in the overdischarged state and the power-down state, the charge control FET is in the off state and the discharge control FET is in the off state. When the charger is connected to the external terminal, the charge/discharge control circuit repeats the following operations of (i) to (vi).

(i) Since the charger is connected, the voltage of the external negative voltage input port drops and exceeds the determination voltage from top to bottom.

(ii) The charge/discharge control circuit transitions from the power-down state to the power-down release state. The FET control circuit may turn on the charge control FET in the power-down release state, and thus transitions the voltage of the charge control terminal from the L level to the H level. When the charge/discharge control circuit is in the overdischarged state and the power-down release state, since the voltage of the charge control terminal is at the H level and the voltage of the discharge control terminal is at the L level, the charge control FET is in the on state and the discharge control FET is in the off state.

(iii) While the charge/discharge control circuit remains in the overdischarged state and the power-down release state, if it becomes necessary to turn off the charge control FET for, for example, a temperature protection state or overcharged state (in the case where the secondary battery includes multiple cells (so-called multi-cell secondary battery)), the FET control circuit transitions the voltage of the charge control terminal from the H level to the L level.

(iv) When the voltage of the charge control terminal transitions from the H level to the L level, the charge control FET transitions from the on state to the off state.

(v) If the charge control FET is in the off state, the charge control terminal and the external negative voltage input port are electrically connected in the internal circuit of the charge/discharge control circuit. When the charge control FET transitions from the on state to the off state, the gate of the charge control FET and the external negative voltage input port are electrically connected, and the gate capacitance of the charge control FET is discharged through the external negative voltage input port. The discharge of the gate capacitance leads to temporarily raise the voltage of the external negative voltage input port.

(vi) At present, the overdischarged state continues. Under the overdischarged state, when the raised voltage of the external negative voltage input port changes from a voltage lower than the determination voltage to a voltage equal to or higher than the determination voltage, the charge/discharge control circuit transitions from the power-down release state to the power-down state again. That is, the charge/discharge control circuit transitions to the overdischarged state and the power-down state. Further, the charge/discharge control circuit transitions the voltage of the charge control terminal from the H level to the L level when transitioning to the power-down state. Because the charger is still connected to the external terminal, immediately after the charge/discharge control circuit transitions to the overdischarged state and the power-down state, the charge/discharge control circuit is in the same state as before the operation of (i) above starts. Thus, in response to a transition to the power-down state, the operation of (i) is subsequently performed.

As described above, in the oscillation operation of the power-down function, the operations of (i) to (vi) are repeated, so that the voltage of the external negative voltage input port and the voltage of the charge control terminal oscillate up and down.

Specifically, first, the voltage of the external negative voltage input port drops during the operation of (i). Subsequently, the voltage of the charge control terminal transitions (rises) from the L level to the H level during the operation of (ii). Subsequently, the voltage of the charge control terminal transitions (drops) from the H level to the L level during the operation of (iii). Subsequently, the voltage of the external negative voltage input port is raised (rises) during the operation of (v). Thereafter, the voltage of the external negative voltage input port drops→the voltage of the charge control terminal transitions from the L level to the H level→the voltage of the charge control terminal transitions from the H level to the L level→the voltage of the external negative voltage input port rises, are repeated. Such oscillation of the voltage of the external negative voltage input port and the voltage of the charge control terminal (hereinafter the oscillation phenomenon of the voltage is referred to as "oscillation") deteriorates the operational stability of the charge/discharge control circuit. The voltage of the charge control terminal is transitioned from the H level to the L level.

The above example of the oscillation operation has been described by taking the oscillation operation of the power-down function of the charge/discharge control circuit as an example, but it is not limited to the charge/discharge control circuit and the power-down function. Oscillation between different terminals can occur in a control circuit, which has all the functions of switching between "on" and "off" or transitioning to different states with a transition of the voltage level of one terminal, and in a circuit, device, apparatus or system including the control circuit. Further, even if oscillation between different terminals does not occur, the transition of the voltage level of one terminal may affect the voltages of different terminals and cause the operation to become unstable.

In view of the above, the present invention provides a mask control circuit, a controller including the mask control circuit, a charge/discharge control circuit, and a battery device which prevent operational instability without compromising the state transition speed.

A mask control circuit in accordance with an embodiment of the present invention is a circuit generating a mask signal which masks a control signal during a period in which a voltage level of a monitoring target terminal to be monitored is transitioning. The mask control circuit includes: a first input port receiving a signal supplied to the monitoring target terminal; a second input port receiving a signal representing the voltage level of the monitoring target terminal; a logic circuit determining whether the voltage level of the monitoring target terminal is in transition based on signals received from the first input port and the second input port; and an output port outputting a signal indicating a determination result of whether the voltage level of the monitoring target terminal is in transition as the mask signal.

A controller in accordance with an embodiment of the present invention is a controller outputting a control signal which is masked. The controller includes a mask control circuit and a state transition control circuit. The mask control circuit includes: a first input port receiving a signal supplied to a monitoring target terminal to be monitored; a second input port receiving a signal representing a voltage level of the monitoring target terminal; and an output port outputting a signal indicating a determination result of whether the voltage level of the monitoring target terminal is in transition based on signals received from the first input port and the second input port. The state transition control circuit includes an input port connected to the output port of the mask control circuit and an output port outputting the control signal, and switches to one of a plurality of states. The state transition control circuit outputs the control signal which is masked during a period in which the voltage level of the monitoring target terminal is transitioning based on the signal indicating the determination result of whether the voltage level of the monitoring target terminal is in transition.

A charge/discharge control circuit in accordance with an embodiment of the present invention is a charge/discharge control circuit which controls charge/discharge of a secondary battery. The charge/discharge control circuit includes: a positive power supply terminal and a negative power supply terminal for monitoring a voltage of the secondary battery; a charge control terminal connected to a gate of a charge control FET which controls charge of the secondary battery; a discharge control terminal connected to a gate of a discharge control FET which controls discharge of the secondary battery; an external negative voltage input port receiving a voltage of an external negative electrode terminal which is connected with the negative terminal of either a charger charging the secondary battery or a load discharging the secondary battery; a monitoring circuit monitoring a voltage of at least the charge control terminal and the external negative voltage input port, and generating a signal representing a voltage level of the charge control terminal, a signal representing a voltage level of the external negative voltage input port, and a signal representing a state of the charge/discharge control circuit based on a monitoring result; and the controller described above. The controller has a state transition function for transitioning between an on state in which a predetermined function is exerted and an off state in which the predetermined function is stopped, and a charge control FET on/off control function and a discharge control FET on/off control function for switching between an on state and an off state of the charge control FET and the discharge control FET; determines whether the voltage level of the monitoring target terminal is in transition based on the signal representing the voltage level of the monitoring target terminal and a signal supplied to the monitoring target terminal while switching between the on state and the off state of the charge control FET and the discharge control FET based on the monitoring result; and temporarily prohibits a state transition between the on state and the off state of the predetermined function when determining that the voltage level of the monitoring target terminal is in transition.

A battery device in accordance with an embodiment of the present invention includes: the charge/discharge control circuit described above; the secondary battery; the external positive electrode terminal and the external negative electrode terminal; the charge control FET provided in a charge/discharge path connecting the external positive electrode terminal and the external negative electrode terminal via the secondary battery; and the discharge control FET provided in the charge/discharge path.

The operational stability can be improved without compromising the speed of transition to a state.

BRIEF DESCRIPTION OF THE DRAWINGS

FIG. 4 is an explanatory diagram illustrating a first example of a correspondence relationship (truth table) between an operation of the mask control circuit and a signal level (H level or L level) according to the present embodiment.

FIG. 5 is an explanatory diagram illustrating a second example of a correspondence relationship (truth table) between an operation of the mask control circuit and a signal level (H level or L level) according to the present embodiment.

DESCRIPTION OF THE EMBODIMENTS

Hereinafter, a mask control circuit, a controller including the mask control circuit, a charge/discharge control circuit, and a battery device according to the embodiments of the present invention will be described with reference to the drawings.

Figure 1:
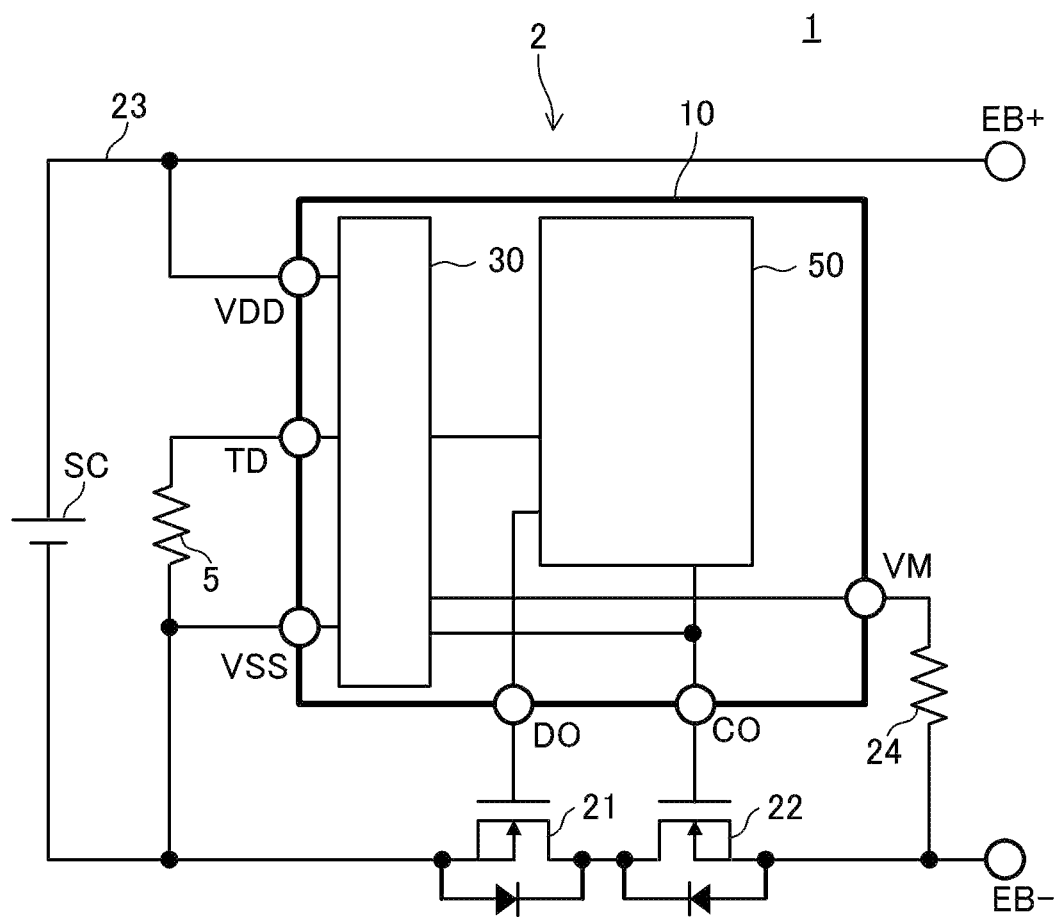
FIG. 1 is a configuration diagram illustrating an example of a charge/discharge control circuit and a battery device according to an embodiment of the present invention.

FIG. 1 is a configuration diagram of a charge/discharge control circuit 10 and a battery device 1 which are examples of the charge/discharge control circuit and the battery device according to an embodiment of the present invention.

The battery device 1 includes a charge/discharge control device 2, a secondary battery SC, external terminals including an external positive electrode terminal EB+ and an external negative electrode terminal EB− to which a charger and a load (not illustrated) can be connected, and a temperature detection element 5 such as an NTC (Negative Temperature Coefficient) thermistor.

The charge/discharge control device 2 includes the charge/discharge control circuit 10, a discharge control FET 21, a charge control FET 22, a charge/discharge path 23, and a resistor 24.

The charge/discharge control circuit 10 includes a monitoring circuit 30 and a controller 50. Further, the charge/discharge control circuit 10 is provided with a positive power supply terminal VDD and a negative power supply terminal VSS for monitoring the voltage of the secondary battery SC, a discharge control terminal DO, a charge control terminal CO, an external negative voltage input port VM, and a temperature detection terminal TD.

The monitoring circuit 30 includes an input port respectively connected to terminals set as monitoring targets (hereinafter referred to as "monitoring target terminals") such as the positive power supply terminal VDD, the negative power supply terminal VSS, the discharge control terminal DO, the charge control terminal CO, the external negative voltage input port VM, and the temperature detection terminal TD, and an output port connected to an input port of the controller 50.

Further, the monitoring circuit 30 has a monitoring function and is configured to be capable of monitoring each voltage of the positive power supply terminal VDD, the negative power supply terminal VSS, the charge control terminal CO, and the external negative voltage input port VM, and the temperature of the secondary battery SC based on the voltage level of the monitoring target terminal. Furthermore, the monitoring circuit 30 is configured to be capable of generating a signal representing the result based on the result of monitoring. The signal representing the result includes, for example, a signal representing the voltage level of the voltage of the charge control terminal CO (hereinafter referred to as "CO voltage"), a signal representing the voltage level of the voltage of the external negative voltage input port VM (hereinafter referred to as "VM voltage"), a temperature protection signal representing the necessity of protection according to whether the temperature of the secondary battery SC is inside or outside a predetermined temperature range, and a signal representing that the charge/discharge control circuit 10 is detected to be in an overcharged state, an overdischarged state, a charge overcurrent state or a discharge overcurrent state.

Besides, the overcharged state, the overdischarged state, the charge overcurrent state, the discharge overcurrent state, and a normal state, the states of the charge/discharge control circuit 10 also include a predetermined function on state provided to the charge/discharge control circuit 10 by exerting a predetermined function and a predetermined function off state in which the predetermined function is stopped.

Here, the overcharged state, the overdischarged state, the charge overcurrent state, the discharge overcurrent state, and the normal state are the same as the states disclosed in the related art as states of a general charge/discharge control circuit. That is, the overcharged state is a state in which the secondary battery SC is higher than a predetermined voltage value. The overdischarged state is a state in which the secondary battery SC is lower than a predetermined voltage value. The charge overcurrent state is a state in which the external terminal is connected to a charger which is abnormal (abnormal charger) and an overcurrent state in which a current larger than a predetermined current value flows to the discharge control FET 21 and the charge control FET 22. The discharge overcurrent state is a state in which a load is connected to the external terminal and an overcurrent state. The normal state is not any of the overcharged state, the overdischarged state, the charge overcurrent state, and the discharge overcurrent state, and is a state in which the secondary battery SC can be charged and discharged.

The predetermined function for switching between the on state and the off state includes, for example, a power-down function for reducing current consumption, a charge control FET protection function for preventing damage to the charge control FET 22, a temperature protection function for stopping at least one of charge and discharge outside a predetermined temperature range, a setting value switching function for switching a setting value such as a delay time or a determination value between a first setting value and a second setting value different from the first setting value, etc.

The on state or off state of the predetermined function is not necessarily a state independent of any of the overcharged state, the overdischarged state, the charge overcurrent state, the discharge overcurrent state, and the normal state. For example, if the predetermined function is the discharge control FET protection function or the charge control FET protection function, the charge/discharge control circuit 10 establishes the off state of the discharge control FET protection function and the normal state.

The controller 50 includes an input port connected to the output port of the monitoring circuit 30, a first output port connected to the charge control terminal CO, and a second output port connected to the discharge control terminal DO.

Outside the charge/discharge control circuit 10, the positive power supply terminal VDD is connected to the positive electrode of the secondary battery SC. The negative power supply terminal VSS is connected to the negative electrode of the secondary battery SC. Further, the negative power supply terminal VSS is connected to the temperature detection terminal TD via the temperature detection element 5. That is, the temperature detection element 5 includes a first terminal connected to the negative power supply terminal VSS and the negative electrode of the secondary battery SC, and a second terminal connected to the temperature detection terminal TD.

The discharge control FET 21 and the charge control FET 22 are, for example, n-channel MOS transistors (NMOS transistors). The gate of the discharge control FET 21 is connected to the discharge control terminal DO. The source of the discharge control FET 21 is connected to, for example, the negative electrode of the secondary battery SC. The drain of the discharge control FET 21 is connected to the drain of the charge control FET 22. The gate of the charge control FET 22 is connected to the charge control terminal CO. The source of the charge control FET 22 is connected to the external negative voltage input port VM via the external negative electrode terminal EB− and the resistor 24.

That is, the discharge control FET 21 includes a gate connected to the discharge control terminal DO, a source connected to the negative electrode of the secondary battery SC, and a drain. The charge control FET 22 includes a gate connected to the charge control terminal CO, a source connected to the external negative voltage input port VM via the external negative electrode terminal EB− and the resistor 24, and a drain connected to the drain of the discharge control FET 21.

The charge/discharge path 23 is a path which connects the external positive electrode terminal EB+ and the external negative electrode terminal EB− via the secondary battery SC. That is, between the external positive electrode terminal EB+ and the external negative electrode terminal EB−, the charge/discharge path 23 which is electrically connected is formed via the secondary battery SC, the discharge control FET 21, and the charge control FET 22.

Figure 2:
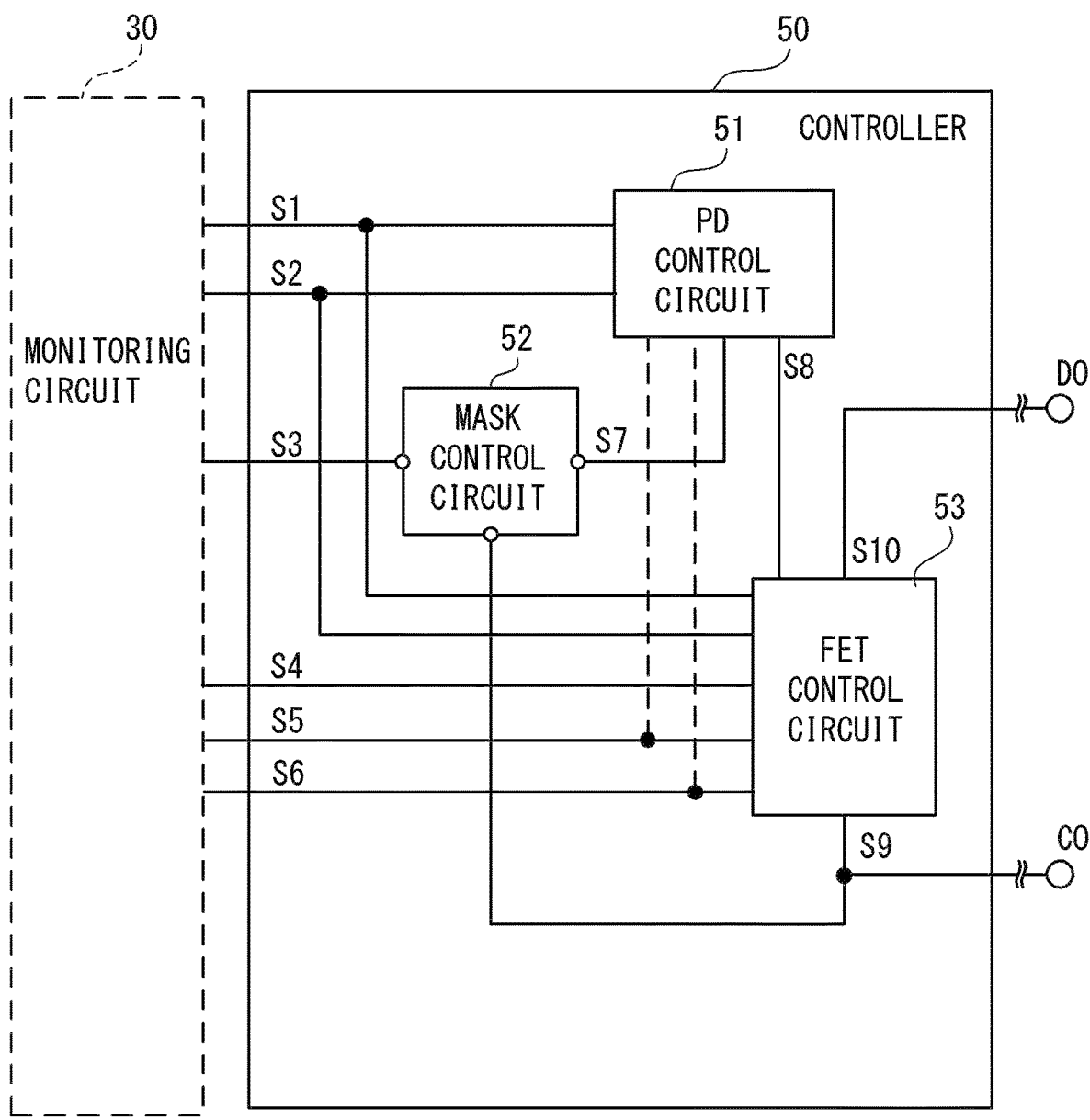
FIG. 2 is a configuration diagram illustrating an example of a mask control circuit and a controller including the mask control circuit according to the present embodiment.

Subsequently, a more specific configuration of the controller 50 serving as a controller will be described. FIG. 2 is a configuration diagram of the controller 50 in the charge/discharge control circuit 10. The controller 50 illustrated in FIG. 2 is an example including a power-down control circuit (hereinafter referred to as "PD control circuit") 51 as a state transition control circuit which controls state switching between a plurality of states, or a predetermined function on/off control circuit which switches between "on" and "off" of a predetermined function. The controller 50 will be described with reference to this example.

The controller 50 has a state transition function, a charge control FET on/off control function, and a discharge control FET on/off control function, and includes the PD control circuit 51, a mask control circuit 52, and a FET control circuit 53.

The PD control circuit 51 has a function of switching between the on state and the off state of the power-down function for reducing the current consumption inside the charge/discharge control circuit 10 as the state transition function. When the overdischarged state is detected and the external negative voltage input port VM voltage is detected to be equal to or higher than the preset determination voltage, the power-down function transitions to the on state of the power-down function, that is, the power-down state. Further, when it is not detected that the VM voltage is equal to or higher than the determination voltage, the power-down function as the predetermined function transitions to the off state of the power-down function, that is, the power-down release state.

The PD control circuit 51 includes a first input port and a second input port connected to the monitoring circuit 30, a third input port connected to the output port of the mask control circuit 52, and an output port connected to a sixth input port of the FET control circuit 53 which will be described later.

In the PD control circuit 51, the first input port receives the overdischarged state detection signal S1 from the monitoring circuit 30. The second input port receives the VM_HDET signal S2 from the monitoring circuit 30. The third input port receives the mask signal S7 from the mask control circuit 52. Further, the power-down signal S8, which will be described later, is supplied to the FET control circuit 53 from the output port of the PD control circuit 51.

Here, for example, the overdischarged state detection signal S1 represents that the overdischarged state is detected if it is at the H level, and that the overdischarged state is not detected if it is at the L level. If the VM_HDET signal S2 is at the H level, it represents that the VM voltage is detected to be at the H level, and if the VM_HDET signal S2 is at the L level, it represents that the VM voltage is detected to be at the L level. For example, when the H level and the L level of the VM voltage are respectively associated with whether the VM voltage is equal to or higher than the preset determination voltage, if the VM_HDET signal S2 is at the H level, it represents that the VM voltage is equal to or higher than the preset determination voltage, and if the VM_HDET signal S2 is at the L level, it represents that the VM voltage is lower than the determination voltage.

For example, if the mask signal S7 is at the H level, it represents that the power-down signal S8 is masked, and if the mask signal S7 is at the L level, it represents that the power-down signal S8 is not masked. The power-down signal S8 represents, for example, that the power-down function is in the on state if it is at the H level, and if it is at the L level, it represents that the power-down function is in the off state.

The mask control circuit 52 prevents the control state from changing during the state transition. The mask control circuit 52 has a function of determining whether the voltage level of the CO voltage is in transition based on the charge control signal S9 and the CO_SCH_HDET signal S3, and a function of generating the mask signal S7 representing whether to mask the on state of the power-down function, the mask signal S7 corresponding to the determination result.

Here, the charge control signal S9 is a control signal for switching and controlling on and off of the charge control FET 22, and is supplied from the FET control circuit 53. The CO_SCH_HDET signal S3 is a signal representing whether the voltage level of the CO voltage is detected to be the H level. If the CO_SCH_HDET signal S3 is at the H level, it represents that the voltage level of the CO voltage is the H level, and if the CO_SCH_HDET signal S3 is at the L level, it represents that the voltage level of the CO voltage is the L level.

The mask control circuit 52 includes a first input port connected to the monitoring circuit 30 and receiving the CO_SCH_HDET signal S3, a second input port connected to the first output port of the FET control circuit 53, which will be described later, and receiving the charge control signal S9, and an output port connected to the third input port of the PD control circuit 51 and supplied with the mask signal S7.

The FET control circuit 53 has a function of generating the charge control signal S9 and a function of generating the discharge control signal S10 for switching and controlling on and off of the discharge control FET 21. By supplying the charge control signal S9 from the FET control circuit 53 to the gate of the charge control FET 22, the charge control FET 22 is controlled and switched on and off. Further, by supplying the discharge control signal S10 from the FET control circuit 53 to the gate of the discharge control FET 21, the discharge control FET 21 is controlled and switched on and off.

The FET control circuit 53 includes a first input port to a fifth input port connected to the monitoring circuit 30, a sixth input port connected to the output port of the PD control circuit 51, a first output port connected to the charge control terminal CO and the second input port of the mask control circuit 52, and a second output port connected to the discharge control terminal DO.

In the FET control circuit 53, the overdischarged state detection signal S1 is received by the first input port. The VM_HDET signal S2 is received by the second input port. The overcharged state detection signal S4 is received by the third input port. The temperature protection signal S5 is received by the fourth input port. The charge overcurrent state detection signal S6 is received by the fifth input port.

Here, for example, if the overcharged state detection signal S4 is at the H level, it represents that the overcharged state is detected, and if the overcharged state detection signal S4 is at the L level, it represents that the overcharged state is not detected. For example, if the temperature protection signal S5 is at the H level, it represents that the on state of the temperature protection function for protecting the secondary battery SC from use outside the predetermined temperature range, that is, the temperature protection state, is detected, and if the temperature protection signal S5 is at the L level, it represents that the off state of the temperature protection function, that is, the temperature protection release state, is detected.

Further, in the FET control circuit 53, the charge control signal S9 is supplied from the first output port to the charge control terminal CO and the mask control circuit 52. The discharge control signal S10 is supplied from the second output port to the discharge control terminal DO.

Figure 3:
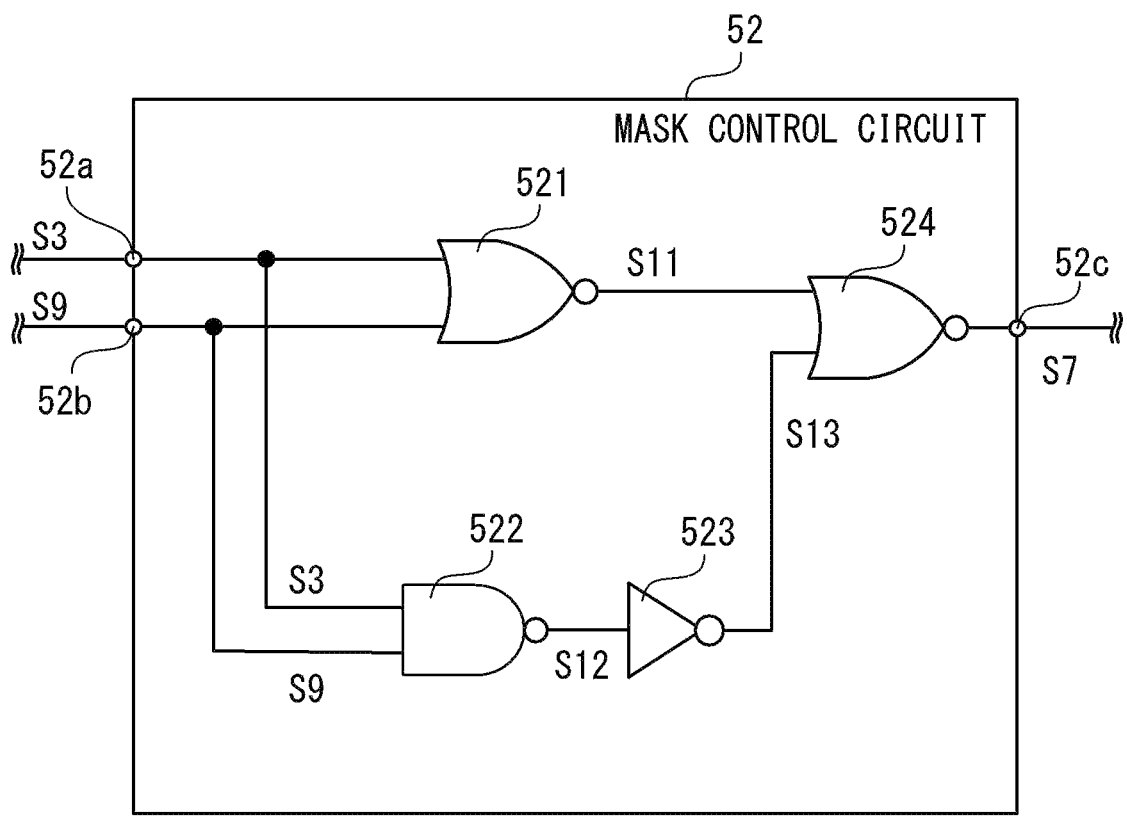
FIG. 3 is a circuit diagram illustrating an example of the mask control circuit according to the present embodiment.

Subsequently, a more specific configuration of the mask control circuit 52 will be described. FIG. 3 is a circuit diagram illustrating an example of the mask control circuit 52.

The mask control circuit 52 is configured by a logic circuit which supplies the mask signal S7 for masking the on state of the power-down function from the output port 52c when determining that the voltage level of the CO voltage is in transition based on the CO_SCH_HDET signal S3 and the charge control signal S9.

The mask control circuit 52 includes, for example, a first input port 52a receiving the CO_SCH_HDET signal S3, a second input port 52b receiving the charge control signal S9, and an output port 52c supplying the mask signal S7, and is configured by a 2-input 1-output logic circuit including NOR elements 521 and 524, a NAND element 522, and an inverter 523, for example.

The NOR element 521 includes a first input port connected to the first input port 52a, a second input port connected to the second input port 52b, and an output port outputting the signal S11 representing the NOR of the CO_SCH_HDET signal S3 and the charge control signal S9.

The NAND element 522 includes a first input port connected to the first input port 52a, a second input port connected to the second input port 52b, and an output port outputting the signal S12 representing the NAND of the CO_SCH_HDET signal S3 and the charge control signal S9.

The inverter 523 includes an input port connected to the output port of the NAND element 522 and an output port outputting the signal S13 obtained by inverting the signal level of the signal S12.

The NOR element 524 includes a first input port connected to the output port of the NOR element 521 and receiving the signal S11, a second input port connected to the output port of the inverter 523 and receiving the signal S13, and an output port connected to the output port 52c and outputting the mask signal S7 which is the NOR of the signal S11 and the signal S13.

Next, the functions (operations) and effects of the charge/discharge control circuit and the battery device according to the present embodiment will be described with reference to FIG. 1 to FIG. 3 described above, with the charge/discharge control circuit 10 and the battery device 1 as an example.

In the charge/discharge control circuit 10, the monitoring circuit 30 monitors the temperature of the secondary battery SC based on the voltages of the positive power supply terminal VDD, the negative power supply terminal VSS, the charge control terminal CO, and the external negative voltage input port VM, and the resistance value of the temperature detection element 5, and supplies a signal indicating the monitoring result to the controller 50.

The controller 50 determines the states such as the normal state, the overcharged state, the overdischarged state, the charge overcurrent state, the discharge overcurrent state, the temperature protection state, the temperature protection release state, the power-down state, and the power-down release state based on the signal indicating the monitoring result, and performs a control operation according to each state.

In the normal state, both the charge control FET 22 and the discharge control FET 21 are in the on state. In the normal state, the FET control circuit 53 supplies a control signal for turning on the charge control FET 22 to the charge control terminal CO, while supplying a control signal for turning on the discharge control FET 21 to the discharge control terminal DO. For example, the FET control circuit 53 supplies the H-level charge control signal S9 as the control signal for turning on the charge control FET 22 to the charge control terminal CO, and supplies the H-level discharge control signal S10 as the control signal for turning on the discharge control FET 21 to the discharge control terminal DO.

In the overcharged state, the charge control FET 22 is in the off state and the discharge control FET 21 is in the on state. In the overcharged state, the FET control circuit 53 supplies a control signal for turning off the charge control FET 22 to the charge control terminal CO, while supplying a control signal for turning on the discharge control FET 21 to the discharge control terminal DO. For example, the FET control circuit 53 supplies the L-level charge control signal S9 to the charge control terminal CO and supplies the H-level discharge control signal S10 to the discharge control terminal DO. In the overcharged state, the discharge control FET 21 is in the on state and the charge control FET 22 is in the off state.

In the overdischarged state, the charge control FET 22 is in the on state and the discharge control FET 21 is in the off state. In the overdischarged state, the FET control circuit 53 supplies a control signal for turning on the charge control FET 22 to the charge control terminal CO, while supplying a control signal for turning off the discharge control FET 21 to the discharge control terminal DO. For example, the FET control circuit 53 supplies the H-level charge control signal S9 to the charge control terminal CO and supplies the L-level discharge control signal S10 to the discharge control terminal DO.

In the charge overcurrent state, the charge control FET 22 is in the off state and the discharge control FET 21 is in the on state. In the charge overcurrent state, the FET control circuit 53 supplies a control signal for turning off the charge control FET 22 to the charge control terminal CO, while supplying a control signal for turning on the discharge control FET 21 to the discharge control terminal DO. For example, the FET control circuit 53 supplies the L-level charge control signal S9 to the charge control terminal CO and supplies the H-level discharge control signal S10 to the discharge control terminal DO. Further, in the charge overcurrent state, the VM voltage is lower than the determination voltage because the charger is connected to the external terminal. That is, the L-level VM_HDET signal S2 is supplied to the FET control circuit 53.

In the discharge overcurrent state, the charge control FET 22 is in the on state and the discharge control FET 21 is in the off state. In the discharge overcurrent state, the FET control circuit 53 supplies a control signal for turning on the charge control FET 22 to the charge control terminal CO, while supplying a control signal for turning off the discharge control FET 21 to the discharge control terminal DO. For example, the FET control circuit 53 supplies the H-level charge control signal S9 to the charge control terminal CO and supplies the L-level discharge control signal S10 to the discharge control terminal DO. Further, in the discharge overcurrent state, since the load is connected to the external terminal, the VM voltage becomes equal to or higher than the determination voltage. That is, the H-level VM_HDET signal S2 is supplied to the FET control circuit 53.

At the time of transitioning from the temperature protection release state to the temperature protection state, charge is prohibited when the charger is connected to the external terminal, and discharge is prohibited when the load is connected to the external terminal. When transitioning from the temperature protection release state to the temperature protection state and the charger is connected to the external terminal, the FET control circuit 53 supplies the L-level charge control signal S9 to the charge control terminal CO. Further, when transitioning from the temperature protection release state to the temperature protection state and the load is connected to the external terminal, the FET control circuit 53 supplies the L-level discharge control signal S10 to the discharge control terminal DO.

On the other hand, at the time of transitioning from the temperature protection state to the temperature protection release state, charge is permitted when the charger is connected to the external terminal, and discharge is permitted when the load is connected to the external terminal. When transitioning from the temperature protection state to the temperature protection release state and the charger is connected to the external terminal, the FET control circuit 53 supplies the H-level charge control signal S9 to the charge control terminal CO. Further, when transitioning from the temperature protection state to the temperature protection release state and the load is connected to the external terminal, the FET control circuit 53 supplies the H-level discharge control signal S10 to the discharge control terminal DO.

Subsequently, as an example of a circuit operation in which the voltage level of the monitoring target terminal transitions when "on" and "off" of the predetermined function are switched or transitioned to different states, the charge/discharge control circuit 10 in which the voltage level of the CO voltage transitions when transitioning from the power-down state to the power-down release state and when transitioning from the power-down release state to the power-down state will be described.

In the charge/discharge control circuit, the CO voltage can be at either the H level or the L level in the power-down state, but here the charge/discharge control circuit 10 in which the CO voltage is at the L level in the overdischarged state and the power-down state will be described as an example.

In the charge/discharge control circuit 10, when the overdischarged state is detected and the VM voltage is detected to be equal to or higher than the determination voltage, the PD control circuit 51 transitions the charge/discharge control circuit 10 from the power-down release state to the power-down state.

In the power-down state, the PD control circuit 51 supplies the H-level power-down signal S8 to the FET control circuit 53. Further, since the overdischarged state is detected, the FET control circuit 53 receives the supply of the H-level overdischarged state detection signal S1. The FET control circuit 53 receives the supply of the H-level overdischarged state detection signal S1 together with the H-level power-down signal S8, and supplies the L-level charge control signal S9 to the charge control terminal CO. Further, the FET control circuit 53 supplies the L-level discharge control signal S10 to the discharge control terminal DO.

When the L-level charge control signal S9 is supplied to the charge control terminal CO, the CO voltage transitions from the H level to the L level, and the charge control FET 22 transitions from the on state to the off state. In the period until the level transition of the CO voltage from the H level to the L level is completed, the VM voltage is temporarily raised, but then returns to the original voltage, that is, the voltage before being raised.

In the controller 50, the mask control circuit 52 outputs the H-level (with mask) mask signal S7 so as to temporarily prohibit the transition of the state during the period until the transition of the CO voltage from the H level to the L level is completed. That is, the power-down signal S8 is masked. In the period until the level transition of the CO voltage from the H level to the L level is completed, the PD control circuit 51 receives the H-level mask signal S7. In response to receiving the H-level mask signal S7, the transition of the state of the charge/discharge control circuit 10 is temporarily prohibited, and therefore the power-down release state is maintained.

In addition, the PD control circuit 51 supplies the masked power-down signal S8, that is, the L-level power-down signal S8, to the FET control circuit 53. The FET control circuit 53 receives the L-level power-down signal S8, and subsequently supplies the L-level charge control signal S9 to the charge control terminal CO. In response to receiving the L-level power-down signal S8 in the FET control circuit 53, within the period when the CO voltage is transitioning from the H level to the L level, even if the VM voltage is temporarily raised and becomes equal to or higher than the determination voltage, the power-down release state of the charge/discharge control circuit 10 is maintained.

When the transition of the CO voltage from the H level to the L level is completed, the mask control circuit 52 outputs the L-level (without mask) mask signal S7. That is, the power-down signal S8 is not masked, and the charge/discharge control circuit 10 transitions from the power-down release state to the power-down state. Further, in the power-down state, the H-level power-down signal S8 indicating the power-down state is supplied from the PD control circuit 51 to the FET control circuit 53. The FET control circuit 53 receives the supply of the H-level power-down signal S8, and subsequently supplies the L-level charge control signal S9 to the charge control terminal CO.

On the other hand, the transition from the power-down state to the power-down release state occurs when the VM voltage drops and exceeds the determination voltage from top to bottom due to the connection of the charger to the external terminal. In this case, the PD control circuit 51 transitions the charge/discharge control circuit 10 from the power-down state to the power-down release state.

In the power-down release state, the PD control circuit 51 supplies the L-level power-down signal S8 to the FET control circuit 53. The FET control circuit 53 receives the supply of the L-level power-down signal S8 and supplies the H-level charge control signal S9 to the charge control terminal CO. Immediately after the transition to the power-down release state, the overdischarged state is continuously detected.

In the controller 50, the mask control circuit 52 outputs the H-level mask signal S7 so as to temporarily prohibit the transition of the state in the period until the transition of the CO voltage from the L level to the H level is completed. In the period until the level transition of the CO voltage from the L level to the H level is completed, the PD control circuit 51 receives the H-level mask signal S7, and the transition of the state of the charge/discharge control circuit 10 is temporarily prohibited. That is, the power-down state is maintained.

When the transition of the CO voltage from the L level to the H level is completed, the mask control circuit 52 outputs the L-level mask signal S7. That is, the power-down signal S8 is not masked, and the charge/discharge control circuit 10 transitions from the power-down state to the power-down release state.

FIG. 4 is an explanatory diagram illustrating a first example of a correspondence relationship (truth table) between the operation of the mask control circuit 52 configured by the logic circuit illustrated in FIG. 3 and the signal level (H level or L level). Here, the first example is an example in which the charge/discharge control circuit 10 transitions between the power-down state and the power-down release state according to the VM voltage. In addition, S3, S9, S11, S13, and S7 in the figure respectively represent the CO_SCH_HDET signal S3, the charge control signal S9, the signal S11, the signal S13, and the mask signal S7, and correspond to the signs of the signals illustrated in FIG. 3.

(A) As described above, when it is detected that the state is the overdischarged state and the VM voltage is equal to or higher than the determination voltage, the PD control circuit 51 transitions the charge/discharge control circuit 10 from the power-down release state to the power-down state. At this time, while the charge control terminal CO receives the L-level charge control signal S9, the transition of the CO voltage from the H level to the L level may be incomplete. When the transition of the CO voltage from the H level to the L level is not completed, the CO_SCH_HDET signal S3, the charge control signal S9, the signal S11, the signal S13, and the mask signal S7 are respectively at the H level, the L level, the L level, the L level, and the H level. That is, in the case of the above (A), the transition between the power-down release state and the power-down state is temporarily prohibited.

(B) When the transition of the CO voltage from the H level to the L level is completed, the CO_SCH_HDET signal S3, the charge control signal S9, the signal S11, the signal S13, and the mask signal S7 are respectively at the H level, the H level, the L level, the H level, and the L level. That is, in the case of the above (B), the transition from the power-down release state to the power-down state is not temporarily prohibited and is permitted.

(C) As described above, when it is detected that the state is the overdischarged state and the VM voltage is less than the determination voltage due to the connection of the charger to the external terminal, the PD control circuit 51 transitions the charge/discharge control circuit 10 to the power-down release state. Here, when the transition of the CO voltage from the L level to the H level is not completed, the CO_SCH_HDET signal S3, the charge control signal S9, the signal S11, the signal S13, and the mask signal S7 are respectively at the H level, the L level, the L level, the L level, and the H level. That is, in the case of the above (C), the transition from the power-down release state to the power-down state is temporarily prohibited.

(D) When the transition of the CO voltage from the L level to the H level is completed, the CO_SCH_HDET signal S3, the charge control signal S9, the signal S11, the signal S13, and the mask signal S7 are respectively at the L level, the L level, the H level, the L level, and the L level. That is, in the case of the above (D), the transition between the power-down release state and the power-down state is not temporarily prohibited and is permitted.

In the charge/discharge control circuit 10 having the temperature protection function, a circuit for switching between the temperature protection state in the on state where the temperature protection function is exerted and the temperature protection release state in the off state where the temperature protection function is stopped can be applied as the state transition control circuit in place of the PD control circuit 51, and can also be applied together with the PD control circuit 51. More specifically, if the PD control circuit 51 has a configuration including a fourth input port supplied with the temperature protection signal S5, it can be configured to transition to the power-down state in the temperature protection state and to the power-down release state in the temperature protection release state.

Subsequently, the charge/discharge control circuit 10 which transitions to the power-down state in the temperature protection state and transitions to the power-down release state in the temperature protection release state, in which the temperature protection function is turned off, will be described as an example. First, the operation when the charger is connected to the external terminal and, while in the overdischarged state, the state transitions to the temperature protection state, in which the temperature protection function is turned on, will be described.

When transitioning from the temperature protection release state to the temperature protection state in the overdischarged state, the H-level temperature protection signal S5 is supplied to the PD control circuit 51 and the FET control circuit 53. The FET control circuit 53 receives the H-level temperature protection signal S5 and supplies the L-level charge control signal S9 to the charge control terminal CO in order to transition to the temperature protection state.

When the FET control circuit 53 supplies the L-level charge control signal S9 to the charge control terminal CO, the CO voltage transitions from the H level to the L level, and the charge control FET 22 transitions from the on state to the off state. Thereafter, it is the same as the case where it is detected that the state is the overdischarged state and the VM voltage is equal to or higher than the determination voltage as described above. That is, in the period until the transition of the CO voltage from the H level to the L level is completed, since the mask control circuit 52 outputs the H-level mask signal S7, the transition from the power-down release state to the power-down state is temporarily prohibited.

When the transition of the CO voltage from the H level to the L level is completed, the mask control circuit 52 outputs the L-level mask signal S7. That is, the power-down signal S8 is not masked and the state transitions from the power-down release state to the power-down state.

Subsequently, the operation when the charger is connected to the external terminal and the state transitions from the temperature protection state to the temperature protection release state while in the overdischarged state will be described. When the charger is connected to the external terminal, and the temperature protection function is turned off to transition to the temperature protection release state while in the overdischarged state, since the PD control circuit 51 and the FET control circuit 53 receive the L-level temperature protection signal S5, the H-level charge control signal S9 is supplied to the charge control terminal CO in order to transition to the temperature protection release state. When the H-level charge control signal S9 is supplied to the charge control terminal CO, the CO voltage transitions from the L level to the H level, and the charge control FET 22 transitions from the off state to the on state. Thereafter, it is the same as the case where the state is the overdischarged state and the VM voltage drops and exceeds the determination voltage from top to bottom as described above.

That is, in the period until the transition of the CO voltage from the L level to the H level is completed, since the mask control circuit 52 outputs the H-level mask signal S7, the transition from the power-down state to the power-down release state is temporarily prohibited.

FIG. 5 is an explanatory diagram illustrating a second example of a correspondence relationship (truth table) between the operation of the mask control circuit 52 configured by the logic circuit illustrated in FIG. 3 and the signal level (H level or L level). Here, the second example is an example in which the charge/discharge control circuit 10 transitions between the power-down state and the power-down release state according to whether the charge/discharge control circuit 10 is in the temperature protection release state or the temperature protection state. In addition, S3, S9, S11, S13, and S7 in the figure respectively represent the CO_SCH_HDET signal S3, the charge control signal S9, the signal S11, the signal S13, and the mask signal S7, and correspond to the signs of the signals illustrated in FIG. 3.

(A) When the temperature protection function is turned on and the state is transitioning from the temperature protection release state to the temperature protection state while in the overdischarged state, that is, when the transition of the CO voltage from the H level to the L level is not completed, the CO_SCH_HDET signal S3, the charge control signal S9, the signal S11, the signal S13, and the mask signal S7 are respectively at the H level, the L level, the L level, the L level, and the H level. That is, in the case of the above (A), the transition between the power-down release state and the power-down state is temporarily prohibited.

(B) When the transition to the temperature protection state is completed, that is, when it is the temperature protection state, the CO_SCH_HDET signal S3, the charge control signal S9, the signal S11, the signal S13, and the mask signal S7 are respectively at the H level, the H level, the L level, the H level, and the L level. That is, in the case of the above (B), the transition from the power-down release state to the power-down state is not temporarily prohibited and is permitted.

(C) When the temperature protection function is turned off and the state is transitioning from the temperature protection state to the temperature protection release state, that is, when the transition of the CO voltage from the L level to the H level is not completed, the CO_SCH_HDET signal S3, the charge control signal S9, the signal S11, the signal S13, and the mask signal S7 are respectively at the H level, the L level, the L level, the L level, and the H level. That is, in the case of the above (C), the transition from the power-down release state to the power-down state is temporarily prohibited.

(D) When the transition to the temperature protection release state is completed, that is, when it is the temperature protection release state, the CO_SCH_HDET signal S3, the charge control signal S9, the signal S11, the signal S13, and the mask signal S7 are respectively at the L level, the L level, the H level, the L level, and the L level. That is, in the case of the above (D), the transition between the power-down release state and the power-down state is not temporarily prohibited and is permitted.

In addition to the charge/discharge control circuit 10 which transitions to the power-down state in the temperature protection state and transitions to the power-down release state in the temperature protection release state, as an example of transitioning between the power-down state and the power-down release state by switching between "on" and "off" or by transitioning between different states, there are cases where the charge/discharge control circuit 10 transitions between the charge overcurrent state in which the charge control FET protection function is in the on state (the charge control FET 22 is in the off state) and the on state of the charge control FET 22, such as the normal state in which the charge control FET protection function is in the off state. In the case of the charge/discharge control circuit 10 having the charge control FET protection function, similar to the charge/discharge control circuit 10 having the temperature protection function, the PD control circuit 51 has a configuration including a fifth input port to which a signal indicating on or off of the charge control FET protection function is supplied.

The mask control circuit according to the present embodiment determines whether the voltage level of the monitoring target terminal is transitioning from the H level to the L level or from the L level to the H level based on the monitoring result of the monitoring target terminal and the voltage level of the supplied signal, and generates a mask signal which temporarily prohibits the switching of on and off of the function or the state transition (switching) when the voltage level of the monitoring target terminal is in transition. Further, the controller, the charge/discharge control circuit, and the battery device according to the present embodiment include the mask control circuit according to the present embodiment. As a result, in the controller, the charge/discharge control circuit, and the battery device according to the present embodiment, it is possible to transition between on and off of the predetermined function without being affected by the fluctuation of the signal level caused by the transition of the voltage level of the monitoring target terminal.

For example, in the charge/discharge control circuit 10, when the charge control FET 22 transitions from the on state to the off state, the predetermined function can be stably transitioned between on and off without being affected by the temporarily raised VM voltage.

Thus, according to the mask control circuit according to the present embodiment, the controller including the mask control circuit, the charge/discharge control circuit, and the battery device, the oscillation state, in which the predetermined function is repeatedly turned on and off, can be avoided without compromising the transition speed when the predetermined function transitions between on and off.

That is, in the mask control circuit according to the present embodiment, the controller including the mask control circuit, the charge/discharge control circuit, and the battery device, oscillation between different terminals such as the external negative voltage input port and the charge control terminal can be prevented, and the operations of the controller including the mask control circuit, the charge/discharge control circuit, and the battery device including the same can be prevented from becoming unstable.

In the embodiment, the mask control circuit is included which generates the mask signal corresponding to whether the voltage level of the monitoring target terminal is in transition and supplies it to, for example, the predetermined function on/off control circuit or the state transition control circuit such as the PD control circuit. According to the mask control circuit according to the present embodiment, the controller including the mask control circuit, the charge/discharge control circuit, and the battery device, it is possible to mask that the predetermined function such as the power-down function is turned on during the voltage level transition of the monitoring target terminal.

Furthermore, according to the mask control circuit according to the present embodiment, the charge/discharge control circuit including the mask control circuit, and the battery device, oscillation of the external negative voltage input port and the charge control terminal can be prevented without newly providing a latch circuit capable of holding information under the power-down state. According to the mask control circuit according to the present embodiment, the charge/discharge control circuit including the mask control circuit, and the battery device, for the charge/discharge control circuit and the battery device which are newly provided with a latch circuit capable of holding information under the power-down state, oscillation of the external negative voltage input port and the charge control terminal can be prevented while an increase in area is suppressed.

Nevertheless, the present invention is not limited to the embodiments as described above, and can be implemented in various forms other than the above-mentioned examples at the implementation stage. Various omissions, replacements, and changes can be made without departing from the gist of the invention.

For example, the mask control circuit 52 and the controller 50 described above exemplify a configuration for one monitoring target, but the present invention is not limited to this example. That is, there may be a plurality of monitoring targets. For example, one mask control circuit 52 including four input ports and two output ports may be formed for two different monitoring targets. Further, a controller 50 including two mask control circuits 52 each including two input ports and one output port may be formed.

Further, the circuit to which the mask control circuit 52 can be applied is not limited to the PD control circuit 51 described above. The mask control circuit 52 can be applied to any circuit in the same manner as for the PD control circuit 51 described above as long as it is a predetermined function on/off control circuit or a state transition control circuit in which the voltage level of the monitoring target terminal transitions when a predetermined function is switched between "on" and "off" or the state is transitioned to a different state. The controller 50, the charge/discharge control circuit 10 or the battery device 1 may be formed to output the output of the mask control circuit 52 to the predetermined function on/off control circuit or the state transition control circuit, together with the PD control circuit 51 or in place of the PD control circuit 51.

For example, the above-described secondary battery SC does not necessarily include one cell (so-called one-cell secondary battery), and may include a plurality of cells (so-called multi-cell secondary battery). That is, the secondary battery SC may include at least one cell.

In the charge/discharge control circuit 10 which controls the charge/discharge of the multi-cell secondary battery SC, it is possible to detect that one cell is in the overdischarged state and another cell is in the overcharged state at the same timing. Thus, it is possible that the overdischarged state and the overcharged state are detected at the same time. In the overdischarged state and the overcharged state, the FET control circuit 53 supplies the L-level charge control signal S9 to the charge control terminal CO as in the overdischarged state and the temperature protection state. The subsequent operation of the controller 50 is the same as in the case of the overdischarged state and the temperature protection state.

For example, the logic circuit constituting the mask control circuit 52 is not limited to the configuration illustrated in FIG. 3. The logic circuit may have any configuration as long as the operation corresponding to the explanatory diagram illustrated in FIG. 4 is performed. Further, although the example illustrates that the mask control circuit 52 is configured to be active (mask effective) at the H level, it may be configured to be active (mask effective) at the L level.

Although the example illustrates that the charge/discharge control circuit 10 and the battery device 1 described above have the temperature protection function, they may not necessarily have the temperature protection function. That is, the charge/discharge control circuit 10 and the battery device 1 may not necessarily include the temperature detection element 5 and the temperature detection terminal TD.

In addition, although the example illustrates that the monitoring target terminal for the mask control circuit 52 described above is the charge control terminal CO, the present invention is not limited to this example. Any terminal which can acquire a signal representing the result of detecting the voltage level of the terminal and a signal representing the voltage level of the signal supplied to the terminal can be set as the monitoring target terminal. In the controller 50, the charge/discharge control circuit 10, and the battery device 1, for example, the discharge control terminal DO may be set as the monitoring target terminal, and the mask signal may be supplied to the state transition control circuit based on the result of determining whether the voltage level of the voltage at the discharge control terminal DO is in transition.

The mask control circuit 52 and the state transition circuit are not necessarily applied to the charge/discharge control circuit 10, and can be applied to each control circuit which can switch a control signal supplied to the control target or the voltage level of the control signal according to the signal from the state transition circuit.

The above-described embodiments and modifications thereof are included in the scope and gist of the invention, and are also included in the scope of the invention described in the claims and the scope equivalent thereto.

What is claimed is:

1. A mask control circuit generating a mask signal which masks a control signal during a period in which a voltage level of a monitoring target terminal to be monitored is transitioning, the mask control circuit comprising:
    a second input port receiving a signal also supplied to the monitoring target terminal;
    a first input port receiving a signal representing the voltage level of the monitoring target terminal;
    a logic circuit determining whether the voltage level of the monitoring target terminal is in transition based on signals received by the second input port and the first input port; and
    an output port outputting the mask signal indicating a determination result of whether the voltage level of the monitoring target terminal is in transition.

2. A controller, outputting a control signal which is masked, the controller comprising:
    a mask control circuit including:
    a second input port receiving a signal also supplied to a monitoring target terminal to be monitored;
    a first input port receiving a signal representing a voltage level of the monitoring target terminal; and
    an output port outputting the control signal indicating a determination result of whether the voltage level of the monitoring target terminal is in transition based on signals received by the second input port and the first input port; and
    a state transition control circuit including an input port connected to the output port of the mask control circuit and an output port outputting the control signal and which switches to one of a plurality of states,
    wherein the state transition control circuit is configured to output the control signal which is masked during a period in which the voltage level of the monitoring target terminal is transitioning based on the signal indicating the determination result of whether the voltage level of the monitoring target terminal is in transition.

3. A charge/discharge control circuit which controls charge/discharge of a secondary battery, the charge/discharge control circuit comprising:
    a positive power supply terminal and a negative power supply terminal for monitoring a voltage of the secondary battery;
    a charge control terminal connected to a gate of a charge control FET which controls charge of the secondary battery;
    a discharge control terminal connected to a gate of a discharge control FET which controls discharge of the secondary battery;
    an external negative voltage input port receiving, among an external positive electrode terminal and an external negative electrode terminal to which either a charger charging the secondary battery or a load discharging the secondary battery is connected, a voltage of the external negative electrode terminal;
    a monitoring circuit monitoring a voltage of the monitoring target terminal, comprising at least the charge control terminal and the external negative voltage input port among terminals included in the charge/discharge control circuit, and generating a signal representing a voltage level of the monitoring target terminal and a signal representing a state of the charge/discharge control circuit based on a monitoring result; and
    the controller according to claim 2,
    wherein the controller has a state transition function for transitioning between an on state in which a predetermined function is exerted and an off state in which the predetermined function is stopped, and a charge control FET on/off control function and a discharge control FET on/off control function for switching between an on state and an off state of the charge control FET and the discharge control FET,
    determines whether the voltage level of the monitoring target terminal is in transition based on the signal representing the voltage level of the monitoring target terminal and a signal supplied to the monitoring target terminal while switching between the on state and the off state of the charge control FET and the discharge control FET based on the monitoring result, and
    temporarily prohibits a state transition between the on state and the off state of the predetermined function when determining that the voltage level of the monitoring target terminal is in transition.

4. The charge/discharge control circuit according to claim 3, wherein the monitoring target terminal comprises the charge control terminal.

5. The charge/discharge control circuit according to claim 3, wherein the monitoring target terminal comprises the discharge control terminal.

6. The charge/discharge control circuit according to claim 3, wherein the controller comprises a FET control circuit which generates a charge control signal for switching and controlling on and off of the charge control FET and a discharge control signal for switching and controlling on and off of the discharge control FET, and supplies the charge control signal to the gate of the charge control FET and supplies the discharge control signal to the gate of the discharge control FET,
    the state transition control circuit comprises a power-down control circuit which supplies to the FET control circuit a control signal for transitioning between a power-down state in which a power-down function for reducing current consumption inside the charge/discharge control circuit is exerted when an overdischarged state of the charge/discharge control circuit is detected, and a power-down release state in which the power-down function is stopped, and
    the mask control circuit determines whether a voltage level of the charge control terminal is in transition based on the charge control signal and a signal representing the voltage level of the charge control terminal, generates a mask signal which is a signal corresponding to a determination result and represents whether to mask an on state of the control signal, and supplies the mask signal to the power-down control circuit.

7. The charge/discharge control circuit according to claim 6, wherein the power-down control circuit comprises an input port receiving a signal representing a temperature protection state in which a temperature protection function for stopping at least one of charge and discharge outside a predetermined temperature range is exerted, and a temperature protection release state in which the temperature protection function is stopped, and supplies to the FET control circuit the control signal for transitioning to the power-down state in the temperature protection state and transitioning to the power-down release state in the temperature protection release state.

8. The charge/discharge control circuit according to claim 6, wherein the power-down control circuit comprises an input port receiving a signal representing an on state of a charge control FET protection function in which the charge control FET protection function for turning off the charge control FET is exerted in a charge overcurrent state, and an off state of the charge control FET protection function for stopping the charge control FET protection function and turning on the charge control FET, and supplies to the FET control circuit the control signal for transitioning to the power-down state in the on state of the charge control FET protection function and transitioning to the power-down release state in the off state of the charge control FET protection function.

9. A battery device, comprising:

the charge/discharge control circuit according to claim 3;

the secondary battery;

the external positive electrode terminal and the external negative electrode terminal;

the charge control FET provided in a charge/discharge path connecting the external positive electrode terminal and the external negative electrode terminal via the secondary battery; and the discharge control FET provided in the charge/discharge path.

* * * * *